(12) United States Patent  
Ravkin et al.

(10) Patent No.: US 7,997,288 B2
(45) Date of Patent: Aug. 16, 2011

(54) SINGLE PHASE PROXIMITY HEAD HAVING A CONTROLLED MENISCUS FOR TREATING A SUBSTRATE

(75) Inventors: Mike Ravkin, Sunnyvale, CA (US); Alex Kabansky, Santa Clara, CA (US); John de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 1022 days.

(21) Appl. No.: 11/774,542

(22) Filed: Jul. 6, 2007

(65) Prior Publication Data
US 2008/0266367 A1    Oct. 30, 2008

Related U.S. Application Data

(63) Continuation-in-part of application No. 11/750,960, filed on May 18, 2007, now Pat. No. 7,387,689.

(51) Int. Cl.
*B08B 3/00* (2006.01)
(52) U.S. Cl. ............... 134/95.2; 134/102.3; 134/902; 34/407
(58) Field of Classification Search ............... 134/56 R, 134/57 R, 58 R, 95.1, 95.2, 95.3, 99.1, 102.3, 134/166 R, 167 R, 198, 902; 34/407, 58, 34/92, 77
See application file for complete search history.

(56) References Cited

U.S. PATENT DOCUMENTS

| | | |
|---|---|---|
| 3,953,265 A | 4/1976 | Hood |
| 4,086,870 A | 5/1978 | Canavello et al. |
| 4,367,123 A | 1/1983 | Beck |
| 4,444,492 A | 4/1984 | Lee |
| 4,838,289 A | 6/1989 | Kottman et al. |
| 5,102,494 A | 4/1992 | Harvey et al. |
| 5,180,431 A | 1/1993 | Sugimoto et al. |
| 5,271,774 A | 12/1993 | Leenaars et al. |

(Continued)

FOREIGN PATENT DOCUMENTS

EP    0 905 746 A1    3/1999
(Continued)

OTHER PUBLICATIONS

J.A. Britten, "A moving-zone Marangoni drying process for critical cleaning and wet processing," Oct. 1997, *Solid State Technology*.

(Continued)

*Primary Examiner* — Joseph L Perrin
(74) *Attorney, Agent, or Firm* — Martine Penilla & Gencarella, LLP

(57) ABSTRACT

A system for processing a substrate is described. The system includes a proximity head, a mechanism, and a liquid supply. The proximity head is configured to generate a controlled meniscus. Specifically, the proximity head has a plurality of dispensing nozzles formed on a face of the proximity head. The dispensing nozzles are configured to supply a liquid to the meniscus and the suction holes are added to remove a used liquid from the meniscus. The mechanism moves the proximity head or the substrate with respect to each other while maintaining contact between the meniscus and a surface of the substrate. The movement causes a thin layer of the liquid to remain on the surface after being contacted by the meniscus. The liquid supply is in fluid communication with the dispensing nozzles, and is configured to balance an amount of the liquid delivered to the meniscus with an amount of liquid removed from the meniscus, the amount of liquid removed from the meniscus including at least the thin layer of the liquid remaining on the surface of the substrate.

16 Claims, 7 Drawing Sheets

U.S. PATENT DOCUMENTS

| | | |
|---|---|---|
| 5,294,257 A | 3/1994 | Kelly et al. |
| 5,343,234 A | 8/1994 | Kuehnle |
| 5,361,449 A | 11/1994 | Akimoto |
| 5,472,502 A | 12/1995 | Batchelder |
| 5,558,111 A | 9/1996 | Lofaro |
| 5,601,655 A | 2/1997 | Bok et al. |
| 5,654,034 A | 8/1997 | Tulloch et al. |
| 5,660,642 A | 8/1997 | Britten |
| 5,696,348 A | 12/1997 | Kawamura et al. |
| 5,705,223 A | 1/1998 | Bunkofske |
| 5,709,757 A | 1/1998 | Hatano et al. |
| 5,807,522 A | 9/1998 | Brown et al. |
| 5,820,686 A | 10/1998 | Moore |
| 5,830,334 A | 11/1998 | Kobayashi |
| 5,882,433 A | 3/1999 | Ueno |
| 5,893,004 A | 4/1999 | Yamamura |
| 5,945,351 A | 8/1999 | Mathuni |
| 5,975,098 A | 11/1999 | Yoshitani et al. |
| 5,989,478 A | 11/1999 | Ouellette et al. |
| 5,997,653 A | 12/1999 | Yamasaka |
| 6,022,099 A | 2/2000 | Chwalek et al. |
| 6,086,454 A | 7/2000 | Watanabe et al. |
| 6,092,937 A | 7/2000 | Snodgrass et al. |
| 6,103,636 A | 8/2000 | Zahorik et al. |
| 6,108,932 A | 8/2000 | Chai |
| 6,132,586 A | 10/2000 | Adams et al. |
| 6,169,244 B1 | 1/2001 | Carlos |
| 6,214,513 B1 | 4/2001 | Cai et al. |
| 6,230,722 B1 | 5/2001 | Mitsumori et al. |
| 6,341,998 B1 | 1/2002 | Zhang |
| 6,391,166 B1 | 5/2002 | Wang |
| 6,398,975 B1 | 6/2002 | Mertens et al. |
| 6,417,117 B1 | 7/2002 | Davis |
| 6,433,541 B1 | 8/2002 | Lehman et al. |
| 6,446,358 B1 | 9/2002 | Mitsumori et al. |
| 6,474,786 B2 | 11/2002 | Percin et al. |
| 6,488,040 B1 | 12/2002 | De Larios et al. |
| 6,491,764 B2 | 12/2002 | Mertens et al. |
| 6,495,005 B1 | 12/2002 | Colgan et al. |
| 6,514,570 B1 | 2/2003 | Matsuyama et al. |
| 6,530,823 B1 | 3/2003 | Ahmadi et al. |
| 6,531,206 B2 | 3/2003 | Johnston et al. |
| 6,550,988 B2 | 4/2003 | Sugimoto et al. |
| 6,555,017 B1 | 4/2003 | Rushford et al. |
| 6,616,772 B2 | 9/2003 | De Larios et al. |
| 6,629,540 B2 | 10/2003 | Mitsumori et al. |
| 6,689,323 B2 | 2/2004 | Fisher et al. |
| 6,764,720 B2 | 7/2004 | Pui et al. |
| 6,799,584 B2 | 10/2004 | Yogev et al. |
| 6,851,435 B2 | 2/2005 | Mertens et al. |
| 6,854,473 B2 | 2/2005 | Hanson et al. |
| 6,954,993 B1 | 10/2005 | Smith et al. |
| 6,988,326 B2 | 1/2006 | O'Donnell et al. |
| 6,988,327 B2 | 1/2006 | Garcia et al. |
| 7,000,622 B2 | 2/2006 | Woods et al. |
| 7,069,937 B2 | 7/2006 | Garcia et al. |
| 7,093,375 B2 | 8/2006 | O'Donnell |
| 7,153,400 B2 | 12/2006 | Ravkin et al. |
| 7,193,232 B2 | 3/2007 | Lof et al. |
| 7,234,477 B2 | 6/2007 | de Larios et al. |
| 7,240,679 B2 | 7/2007 | Woods et al. |
| 7,252,097 B2 | 8/2007 | Boyd et al. |
| 2002/0121290 A1 | 9/2002 | Tang et al. |
| 2003/0091754 A1 | 5/2003 | Chihani et al. |
| 2003/0092264 A1 | 5/2003 | Kajita et al. |
| 2004/0069319 A1 | 4/2004 | Boyd et al. |
| 2005/0132515 A1 | 6/2005 | Boyd et al. |
| 2005/0139318 A1 | 6/2005 | Woods et al. |
| 2005/0145265 A1 | 7/2005 | Ravkin et al. |
| 2005/0145267 A1 | 7/2005 | Korolik et al. |
| 2005/0145268 A1 | 7/2005 | Woods |
| 2005/0148197 A1 | 7/2005 | Woods et al. |
| 2005/0217703 A1 | 10/2005 | O'Donnell |
| 2007/0146399 A1 | 6/2007 | Yamamoto et al. |

FOREIGN PATENT DOCUMENTS

| | | |
|---|---|---|
| EP | 0 905 747 A1 | 3/1999 |
| EP | 1 489 461 A1 | 12/2004 |
| EP | 1 489 462 A2 | 12/2004 |
| EP | 1 571 697 A1 | 9/2005 |
| JP | 05837190 | 3/1983 |
| JP | 62150828 A | 7/1987 |
| JP | 02280330 | 11/1990 |
| JP | 02309638 | 12/1990 |
| JP | 08277486 | 10/1996 |
| JP | 9199488 | 7/1997 |
| JP | 11-042057 | 2/1999 |
| JP | 11031672 | 2/1999 |
| JP | 11-309400 | 11/1999 |
| JP | 11350169 | 12/1999 |
| JP | 2001220688 | 8/2001 |
| JP | 2003-151948 | 5/2003 |
| TW | 480221 | 3/2002 |
| TW | 483075 | 4/2002 |
| TW | 503455 | 9/2002 |
| TW | 542791 | 7/2003 |
| WO | WO 99/16109 A1 | 4/1999 |
| WO | WO 99/49504 | 9/1999 |
| WO | WO 02/01613 A3 | 1/2002 |
| WO | WO 02/32825 A1 | 4/2002 |
| WO | WO 02/101795 A3 | 12/2002 |
| WO | WO 03/014416 A3 | 2/2003 |
| WO | WO 03/087436 A1 | 10/2003 |
| WO | WO 2004/030051 A3 | 4/2004 |

OTHER PUBLICATIONS

Owa et al. "*Immersion lithography; its potential performance and issues*", Proceedings of the SPIE, SPIE, Bellingham, VA, US, vol. 5040, No. 1, Feb. 28, 2003, pp. 724-733, XP002294500.

Lim et al., "*Atomic Layer deposition of transition metals*", Department of Chemistry and Chemical Biology, Harvard University, Nature Publishing Group, vol. 2, Nov. 2003, pp. 749-754.

ICKnowledge LLC, "*Technology Backgrounder: Atomic Layer Deposition*", ICKnowledge.com, 2004, pp. 1-7.

"*Chemical vapor deposition*", Wikipedia, the free encyclopedia, http://en.wikipedia.orq/wiki/Chemical_vapor_deposition, 2005, p. 1-2.

SIGMA-ALDRICH, "*Atomic Layer Deposition (ALD)*", http://www.sigmaaldrich.com/Area_of_Interest/Chemistry/Materials_Science/Thin_Films, 2005, pp. 1-2.

U.S. Appl. No. 10/834,548, filed Apr. 28, 2004, Hemker et al.
U.S. Appl. No. 11/173,729, filed Jun. 30, 2005, Ravkin et al.

SINGLE PHASE PROXIMITY HEAD HAVING A CONTROLLED MENISCUS FOR TREATING A SUBSTRATE

CLAIM OF PRIORITY

This Application is a continuation-in-part application under 35 U.S.C. §120 and claims priority from U.S. patent application Ser. No. 11/750,960 filed on May 18, 2007, now U.S. Pat. No. 7,387,689, issued on Jun. 17, 2008, entitled "Methods For Drying Semiconductor Wafer Surfaces Using A Plurality Of Inlets And Outlets Held In Close Proximity To The Wafer Surfaces," which claims priority from U.S. patent application Ser. No. 10/261,839 filed on Sep. 30, 2002, now U.S. Pat. No. 7,234,477, issued on Jun. 26, 2007, entitled "Method And Apparatus For Drying Semiconductor Wafer Surfaces Using A Plurality Of Inlets And Outlets Held In Close Proximity To The Wafer Surface," which are herein incorporated by reference.

CROSS REFERENCE TO RELATED APPLICATIONS

The present Application is related to the following U.S. Patents and U.S. Patent Applications, all of which are incorporated herein by reference in their entirety: U.S. patent application Ser. No. 11/173,729, filed Jun. 30, 2005 and entitled "A Method And Apparatus For Atomic Layer Deposition (ALD) In A Proximity System;" and U.S. patent application Ser. No. 11/539,611, filed Oct. 6, 2006 and entitled "Proximity Processing Using Controlled Batch Volume With An Integrated Proximity Head.

BACKGROUND

In the manufacture of integrated circuit (IC) devices, a semiconductor substrate, such as a silicon wafer, is processed by placing the substrate through any number of process steps. Such steps include deposition steps, removal steps, patterning steps (e.g., photolithography), and doping. In many instances, material is removed, added, or modified by exposing the substrate to a chemical for a period of time. In addition, there may be cleaning and rinsing steps to remove residue of the chemical left on the substrate, which could damage the device if allowed to remain.

As IC device features continue to decrease in size, existing methods for processing wafers by exposing the wafers to liquid chemicals have become inadequate. For example, a traditional immersion method, whereby a substrate is submerged in a liquid chemical, such as an organic solvent chemical or wet etching chemical, does not provide sufficient control over contact time between the substrate and the chemical. For example, the upper portion of the substrate may be the last to be lowered into the chemical and the first to be lifted out from the chemical. Furthermore, after being raised out of the chemical, the substrate may still have a layer of chemical adhered to the surface of the substrate for some time until the substrate can be moved to a rinsing and drying station. It would be desirable to more precisely control the contact time and the time to rinse.

In addition, substrate immersion does not provide an efficient use of the chemicals. For example, immersion requires significantly more chemical liquid than necessary to carry out the desired chemical reaction or process. In some instances, this liquid cannot be reused, or can only be reused a limited number of times. It would therefore be desirable to reduce the amount of chemical usage for a given process.

Finally, immersion techniques are amenable to batch processing, wherein a number of substrates are lowered into the chemical at the same time. While this improves the efficiency of the immersion technique, it requires additional handling of the substrate to load a number of substrates into a tray and then unload them. Each time a substrate is handled, i.e., moved from one process station to the next, it delays the time to the next process step. In addition, a time delay between removal of a substrate from a chemical and washing, rinsing, and drying operations can vary when a number of substrates are removed at once, but then are further processed only one at a time. It would be desirable to handle a substrate fewer times, and to provide for more consistent handling of substrates from one substrate to the next.

To overcome the advantages noted above, there is a need for improved mechanisms for treatment of a substrate with a liquid chemical.

SUMMARY

Broadly speaking, the present invention fills these needs by providing various techniques for wet treatment of substrates including etching, cleaning, wetting, washing, rinsing and drying resulting in a removal of unwanted layers, residuals, contaminants, watermarks, etc. left on the surface during previous processing steps.

It should be appreciated that the present invention can be implemented in numerous ways, including as a process, an apparatus, a system, a device, or a method, Several inventive embodiments of the present invention are described below.

In one embodiment, a system for processing a substrate is provided. The system includes a proximity head, a mechanism to move the proximity head with respect to a substrate (or a substrate with respect to proximity head, or both), and a liquid management system providing fluid communication with the proximity head. The proximity head is configured to generate on a surface of a substrate a controlled meniscus. Specifically, the proximity head has a plurality of distinct dispensing nozzles formed on a face of the proximity head, the dispensing nozzles being configured to supply a liquid to the meniscus, and plurality of distinct retrieving nozzles formed to remove a liquid from a meniscus after contacting with substrate. The mechanism to move the proximity head, or a substrate, or both with respect one to another, maintains controllable contact between the meniscus and a surface of the substrate and causes a thin layer of the liquid to remain on the surface after being contacted by the meniscus. The liquid supply is configured to balance an amount of the liquid delivered to the meniscus with an amount of liquid removed from the meniscus, the liquid removed including at least the thin layer of the liquid remaining on the substrate.

In another embodiment, a method for processing a substrate is provided. The method includes generating a controlled meniscus using a proximity head, the proximity head having a face in close proximity to a surface of the substrate. The controlled meniscus is generated by delivering a chemical to the meniscus through discrete nozzles formed in the face of the proximity head. The proximity head is moved over the substrate so that an area of contact between the meniscus and the substrate moves from one location to another location on the substrate. The moving of the proximity head causes a chemical remainder to be left behind the surface of the substrate at the first location, the chemical remainder being a layer of the chemical from the meniscus that adheres to the surface of the substrate. An amount of chemical being delivered to the proximity head is balanced with an amount of chemical removed from the meniscus back to the head (static mode), or with an amount of chemical removed from the meniscus back to the head and the chemical remainder (dynamic mode), so that the meniscus maintains a substantially constant volume of the chemical.

The advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention. The term, "meniscus," as used herein, refers to a volume of liquid bounded and contained in part by surface tension of the liquid. The meniscus is also controllable and can be moved over a surface in the contained shape. In specific embodiments, the meniscus is maintained by the delivery of fluids to a surface while also removing the fluids so that the meniscus remains controllable. Furthermore, the meniscus shape can be controlled by precision fluid delivery and removal systems that are in part interfaced with a controller a computing system, which may be networked. In some embodiments, a fluid delivery system is provided and no fluid removal system is provided, as described in more detail below.

Figure 1:
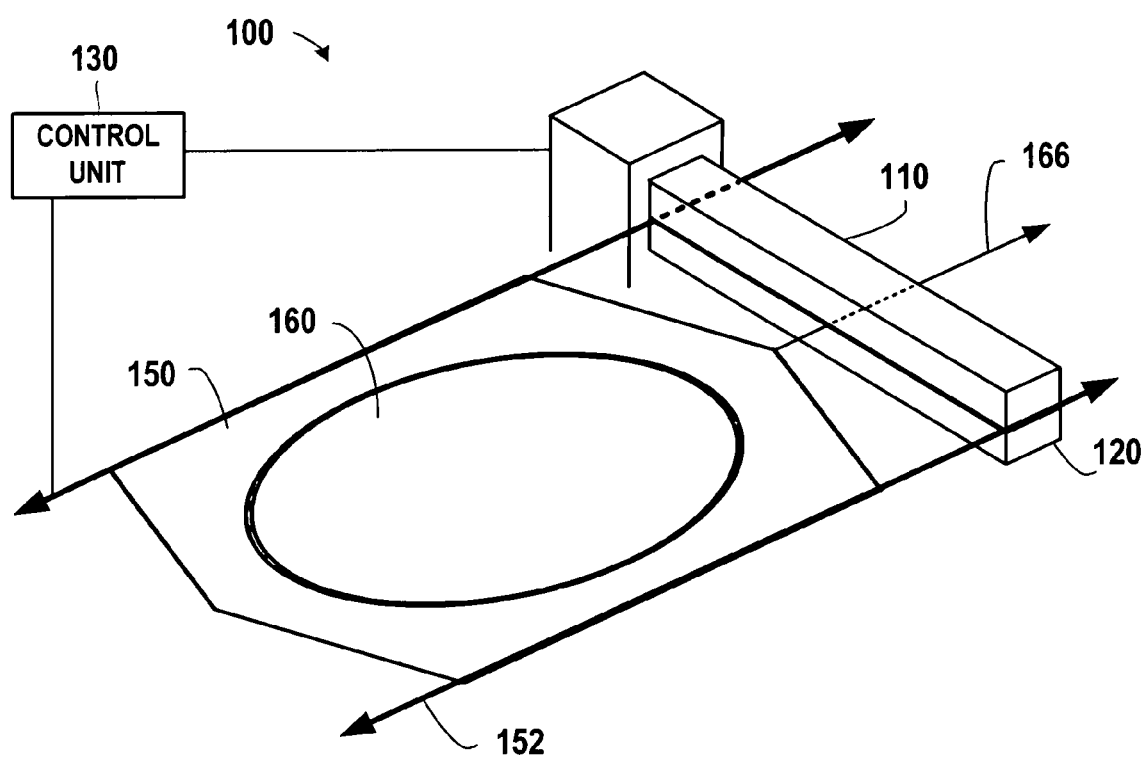
FIG. 1 is a perspective view of an exemplary implementation of a substrate processing system.

FIG. 1 is a perspective view of an exemplary implementation of a substrate processing system 100. In this example, substrate 160 is positioned within a carrier 150 which passes between upper proximity head 110 and lower proximity head 120 in the direction of arrow 166. In one embodiment, substrate 160 comprises a semiconductor wafer, such as a single crystal silicon wafer. Upper and lower proximity heads 110, 120, form a meniscus of fluid between them. Carrier 150 may be connected to track mechanism 152, represented schematically as two double-headed arrows on either side of carrier 150. In one embodiment, track mechanism 152 comprises two slotted rails on either side of carrier with a device that engages carrier 150 and causes carrier 150 to move between upper and lower proximity heads 110, 120 in the direction of arrow 166. In one embodiment, a substrate 160 is deposited on carrier 150 at a first location on one side of proximity heads 110, 120, and removed when carrier 150 arrives at a second location on an opposite side of proximity heads 110, 120. Carrier 150 may then pass back through proximity heads 110, 120, or over, under, or around proximity heads 110, 120, back to the first location, where a next substrate is deposited, and the process is repeated.

Although only pair of upper and lower proximity heads 110, 120 is shown, any number of proximity heads, generating a plurality of menisci side-by-side, with carrier 150 passing through each in series. A plurality of menisci can be used, for example, to perform a plurality of treatment steps, such as etch, clean, and then rinse and dry. Furthermore, it is not required to have both an upper and lower proximity head, since a controlled meniscus can be generated on one side of a substrate with a single proximity head.

It should further be noted that, while in the example shown in FIG. 1, the substrate moves through proximity heads 110, 120 in the direction of arrow 152, it is also possible for the substrate to remain stationary while the proximity heads 110, 120, pass over and under the substrate. Furthermore, the orientation of the substrate as it passes between the proximity heads is arbitrary. That is, the substrate is not required to be oriented horizontally, but can instead be vertically oriented or at any angle.

In certain embodiments, a controller 130, which may be a general purpose or specific purpose computer system whose functionality is determined by logic circuits or software, or both, controls the movement of carrier 150 and the flow of fluids to upper and lower proximity heads 110, 120. The flow of fluids to and from proximity heads 110, 120 is controlled to maintain the meniscus in a stable state.

Figure 2:
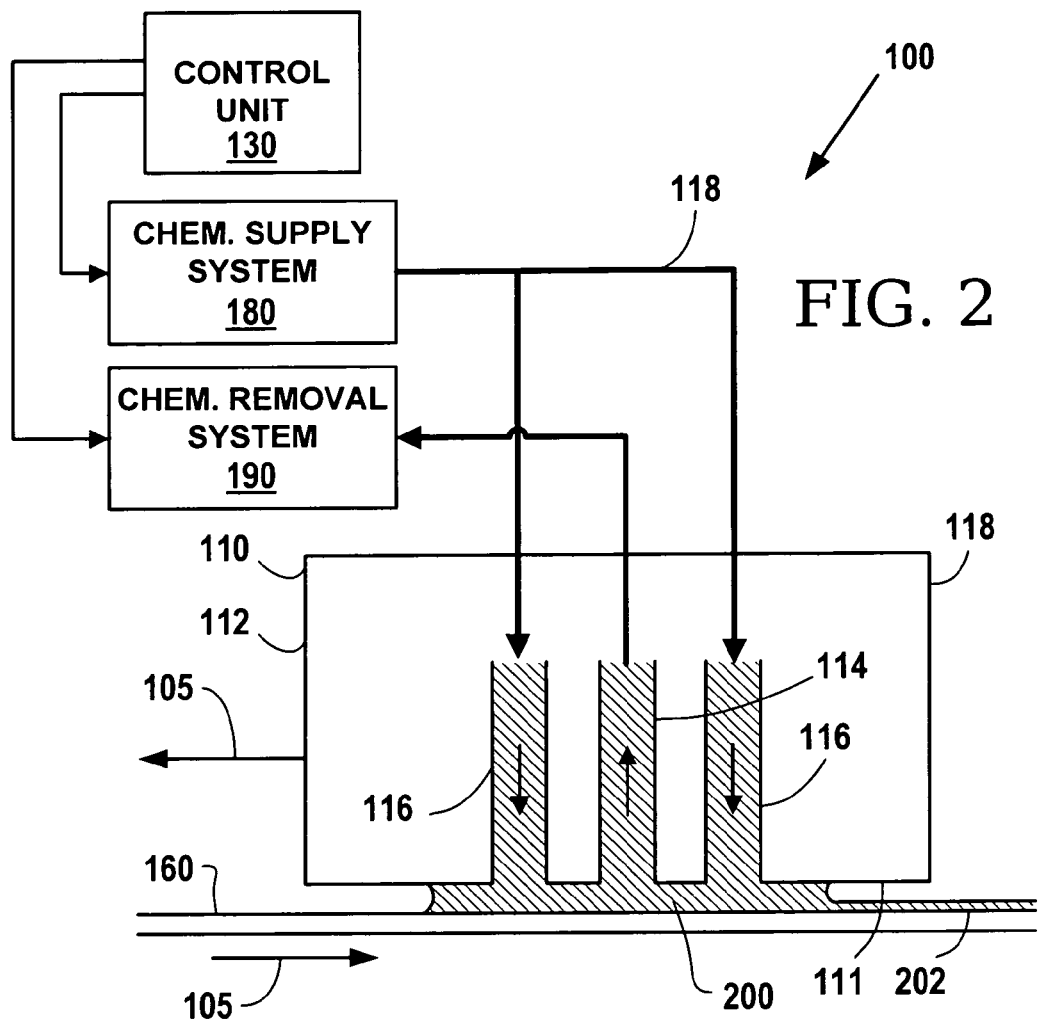
FIG. 2 shows by way of example, a schematic representation of a system for supplying a chemical to a substrate using a controlled meniscus.

FIG. 2 shows by way of example, a schematic representation of a system for supplying a chemical to a substrate using a controlled meniscus. As shown in FIG. 2, proximity head 110 moves to the left and/or substrate 160 moves to the right as shown by arrows 105 so that there is relative movement between proximity head 110 and substrate 160. As a result of the relative movement, the controlled meniscus 200, and the hydrophilicity of the substrate and/or surfactant content of the chemical, a thin layer or film of chemical remainder 202 adheres to substrate 160 so that substrate 160 is effectively wetted by proximity head 110. It should be noted that FIG. 2, being a schematic representation, is not intended to accurately represent relative dimensions of the various features shown.

Proximity head 110 includes at least one dispensing nozzle 116 (two are shown in FIG. 2) formed in a face 111 of proximity head 110 through which a liquid is supplied to form a meniscus 200. The face 111 includes at least one flat region disposed proximate to and substantially parallel to surface of a substrate 160, although multiple flat regions could be implemented having varying elevations and/or shapes. The liquid may be deionized water, RCA Clean chemicals, or other liquid designed to process substrate 160. In addition, proximity head 110 includes one or more suction ports 114 (only one shown) applying a controlled suction to meniscus 200. In one embodiment, suction ports 114 aspirate, substantially only liquid from meniscus 200, and not surrounding gases.

The lower proximity head 120, not shown in FIG. 2, may be provided as a mirror image to the upper proximity head, and may operate in a similar manner. More details relating to proximity head structure and operation are incorporated by reference in the Cross Reference to Related Art section above. In particular, U.S. patent applications Ser. No. 10/261,839, 10/330,843, and 10/330,897 are referenced for additional details relating to proximity head structure and operation.

Substrate processing system 100 also includes a chemical supply system 180 and a chemical removal system 190. Chemical supply system 180 and chemical removal system 190 may be connected to one another to allow recycling of chemicals. For example, a tertiary recycling system (not shown) may receive used chemical from chemical removal system 190 and treat the used chemical, e.g., by filtering, distilling, or other operations, before returning the used chemical to chemical supply system 180. Chemical supply system 180 may include heating means (not shown) for heating the chemical, e.g., to enhance the reacting power of the chemical. Control unit 130 regulates the operation of chemical supply and retrieval systems 180, 190 to ensure that the chemical flows to and from meniscus 200 are at controlled rates so that meniscus 200 remains in a stable state. By "a stable state," it is meant that the meniscus has a substantially constant volume, spillage from the meniscus, which may be expected at the edges of the substrate, is controlled and compensated for. Thus, the fluid flowing to and from meniscus 200 is substantially balanced, with only sufficient additional fluid flowing to the meniscus to compensate for fluid 202 remaining on the meniscus and the expected amount, if any, of spillage.

In one embodiment, proximity head 110 includes a plurality of dispensing nozzles 116 surrounding a plurality of suction ports 114 as shown and described in more detail below with reference to FIG. 4. However, other configurations of nozzles are possible. For example, dispensing nozzles 116 may be provided along a leading edge 112 of proximity head 110 and suction ports 114 may be provided along a trailing edge 118 of proximity head 110. In other embodiments, described in more detail below with reference to FIG. 7, only dispensing nozzles 116 are provided and no suction nozzles are needed. Although various configurations of nozzles are possible, in one embodiment, each configuration includes dispensing nozzles 116 formed as independent and discrete through-holes extending from a face 111 of proximity head 110 to an internal manifold (not shown) which equalizes fluid pressure among the nozzles, thereby ensuring each nozzle receives fluid or a vacuum at a pressure consistent with other nozzles.

Figure 3:
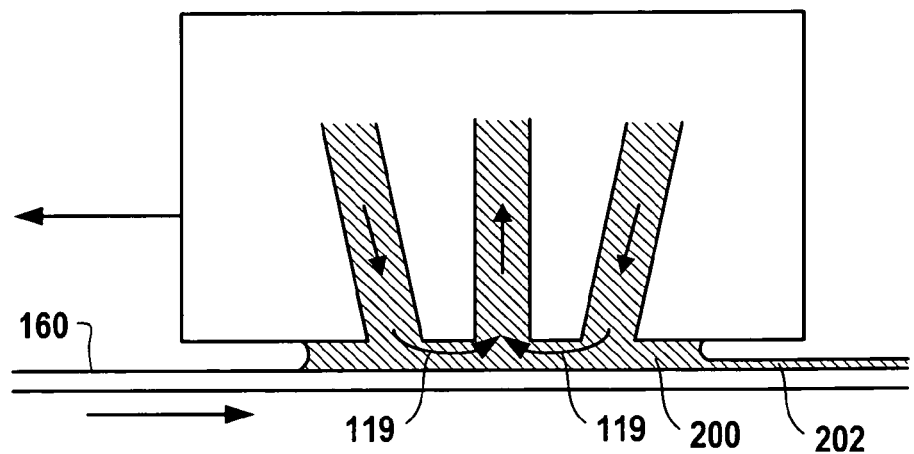
FIG. 3 shows by way of example a schematic representation of a proximity head having angled dispensing nozzles.

FIG. 3 shows by way of example a schematic representation of a proximity head 110'. Proximity head 110' includes dispensing nozzles 116 that are angled to promote a flow of the chemical along arrows 119. Depending on the flow rate and viscosity of the chemical, as well as other factors such as the hydrophobicity of substrate 160, angled dispensing nozzles 116' may improve fluid dynamics within meniscus 200.

Figure 4:
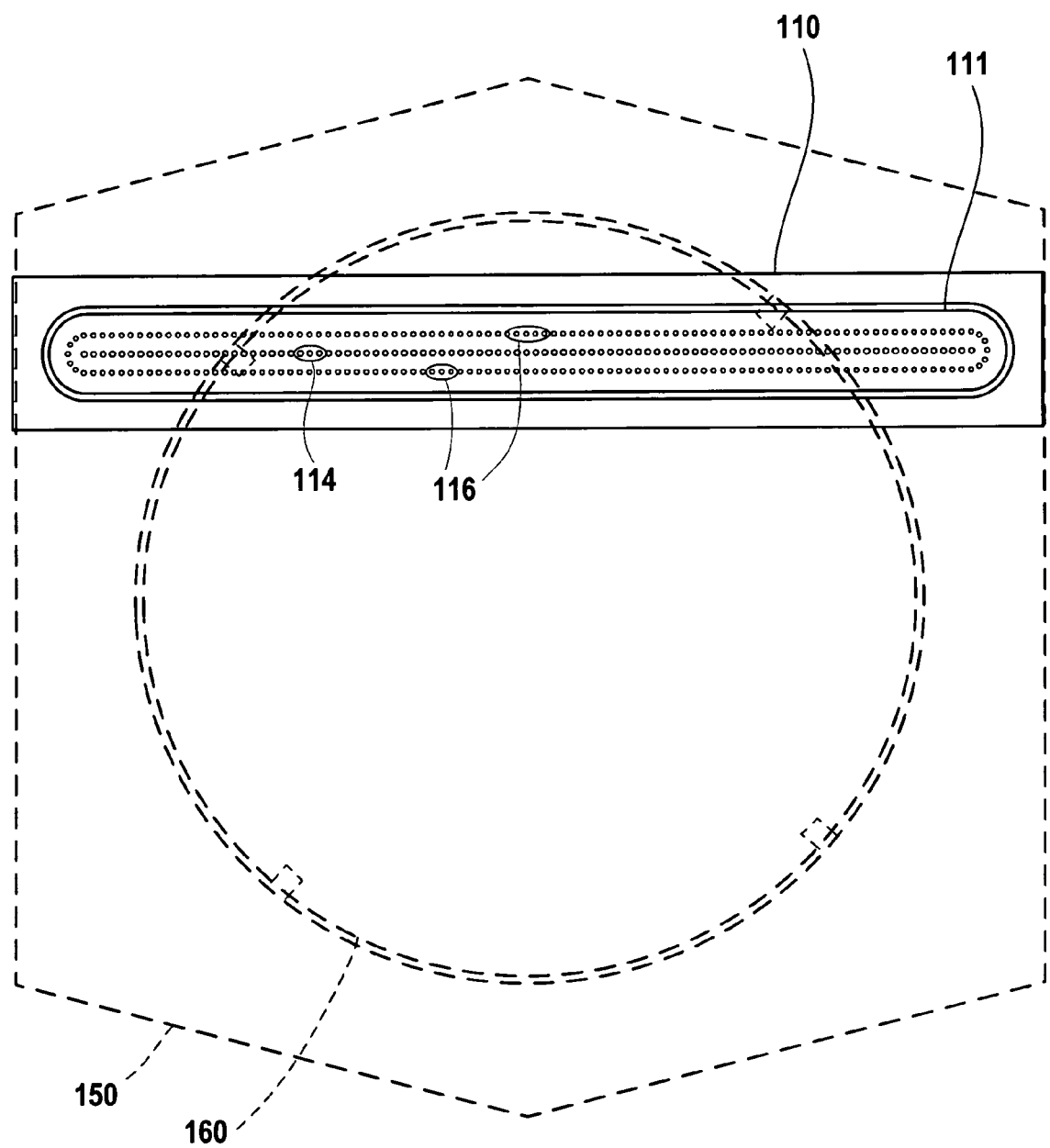
FIG. 4 shows a bottom view of an exemplary proximity head with a wafer and carrier shown in phantom.

FIG. 4 shows a bottom view of an exemplary proximity head 10 with wafer 160 and carrier 150 shown in phantom. Face 111 of proximity head 110 includes a substantially flat surface disposed substantially parallel to substrate 160. Face 111 also includes a plurality of distinct dispensing ports 116 surrounding a plurality of distinct suction ports 114. This configuration is presented for exemplary purposes only and other configurations are possible. For example, in one embodiment, suction ports 114 are not provided or are replaced with additional dispensing nozzles 116. In another embodiment, the dispensing nozzles 116 are surrounded by suction ports 114. In another embodiment, a row of dispensing nozzles 116 are disposed at a leading edge of proximity head 110 and a row of suction ports 114 are disposed along a trailing edge of proximity head 110. By "leading edge" it is meant the forward edge of proximity head that is first to encounter a substrate when moving in relation to the substrate. In yet another embodiment, dispensing nozzles 116 are interspersed with suction ports 114, e.g., in a checker-board pattern.

Figure 5:
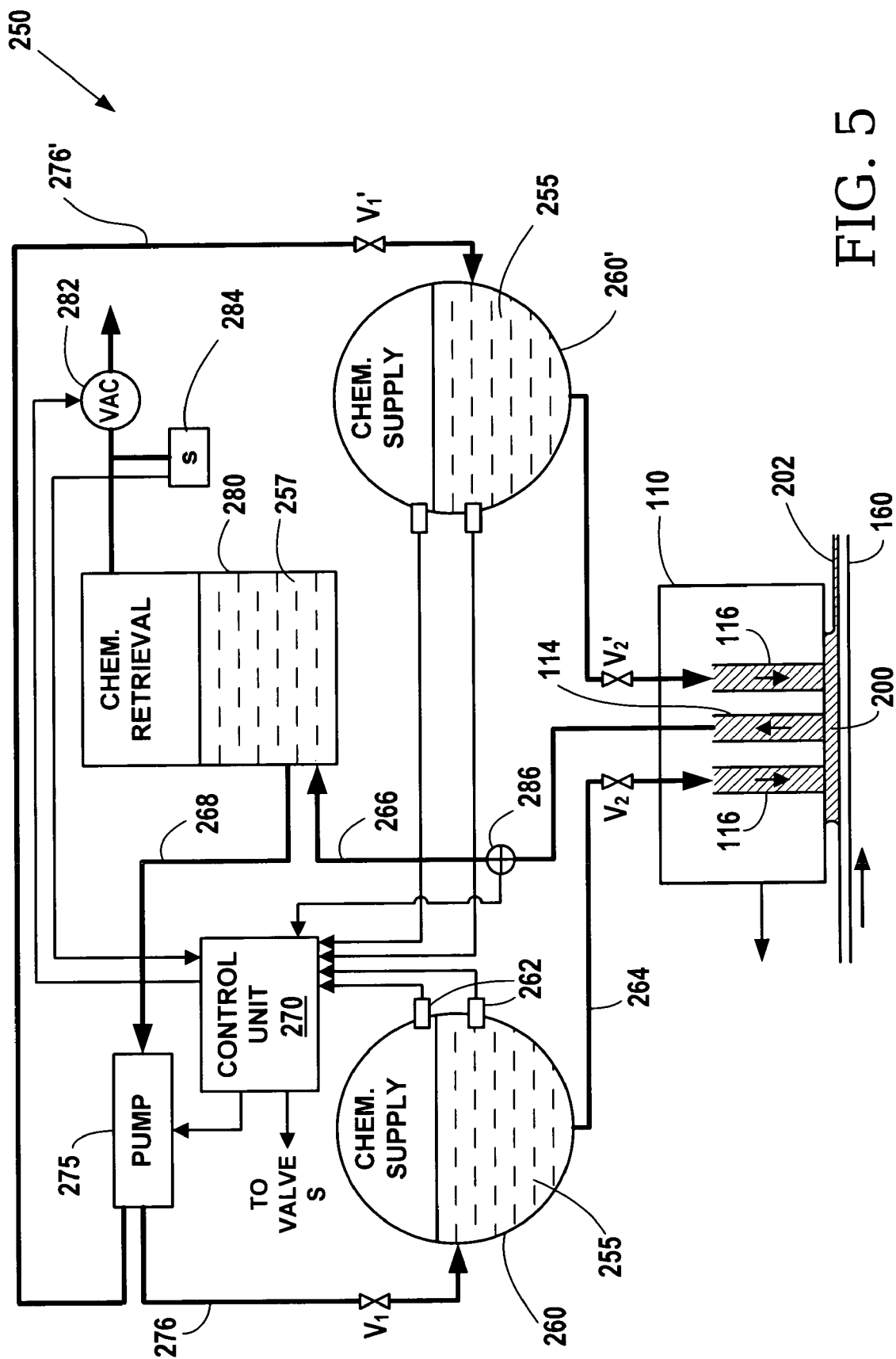
FIG. 5 shows exemplary meniscus control system with chemical recycling.

FIG. 5 shows exemplary meniscus control system 250 with chemical recycling. Chemical 255, such as a chemical composition for processing or cleaning substrate 160, is held by chemical supply tanks 260, 260'. When valves $V_2$ and $V_2'$ are opened by control unit 270, chemical 255 is allowed to flow under the influence of gravity through fluid lines 264, 264' to dispensing nozzles 116 to form meniscus 200. Chemical retrieval tank 280 is held under a vacuum by vacuum pump 282 and control unit 270 in response to pressure sensor 284 and flow meter 286. Since chemical retrieval tank 280 is in fluid communication with suction port 114 via fluid line 266, some of chemical 255 in meniscus 200 is drawn up to chemical retrieval tank 280. In one embodiment, the vacuum in chemical retrieval tank 280 is adjusted until a predetermined fluid flow is registered by flow meter 286.

Sensors 262, 262' signal control unit 270 when the liquid level in chemical supply tanks 260, 260' becomes too high or too low. In response to a signal indicating that liquid is too low, control unit 270 operates pump 275 to recycle used chemical 257 from chemical retrieval tank 280 to chemical supply tanks 255, 255' via fluid lines 268, 276, and 276'. Valves $V_1$, $V_1'$ are operated by control unit 270 to ensure that recycled chemical is supplied to the correct chemical supply tank.

Figure 6:
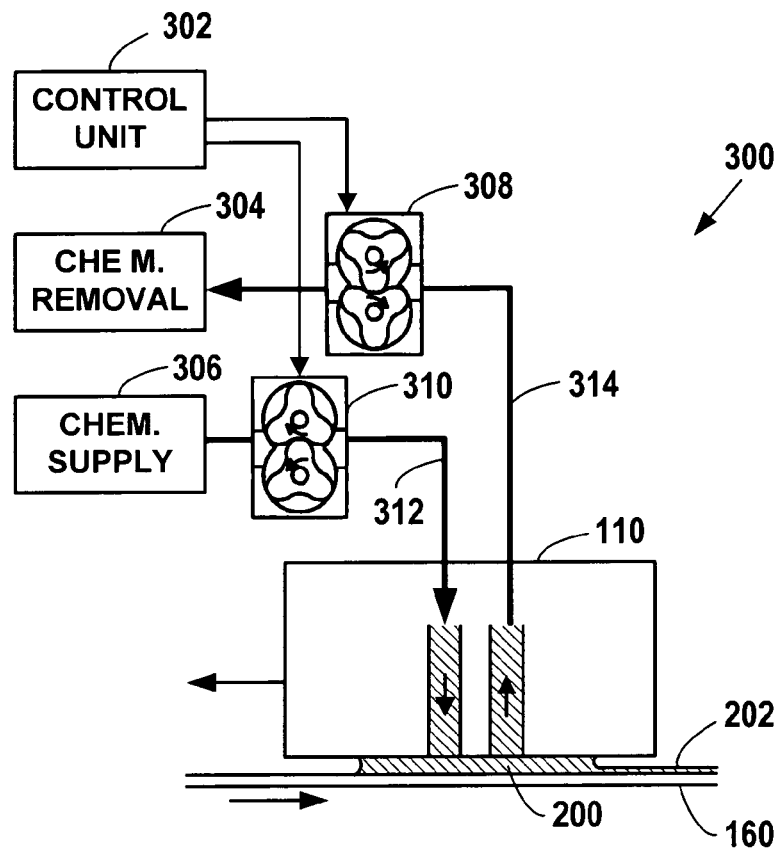
FIG. 6 shows exemplary meniscus control system wherein metering pumps are used to control the meniscus.

FIG. 6 shows exemplary meniscus control system 300 wherein metering pumps 308, 310, are used to control meniscus 200. Specifically, control unit 302 operates metering pump 310 to draw chemical from chemical supply 306 and supply it in a controlled volumetric flow rate to meniscus 200 by way of dispensing nozzle 116. Metering pump 308 is likewise driven to remove chemical from meniscus 200 and pass the used chemical to chemical removal system 304. Metering pumps 310, 308 are each capable of transferring chemicals from their respective inputs to their respective outputs at precise volumetric flow rates over a wide range of pressure differentials between their inlets and outlets. Although schematically represented with lobe-style impellers, any type of metering pump can be used. In one embodiment, control unit 302 drives metering pump 310 to deliver chemical to meniscus 200 at a higher flow rate when forming meniscus 200, and then a lower rate of flow once meniscus 200 is formed. In another embodiment, not mutually exclusive with other embodiments described herein, control unit 302 drives metering pump 308 to remove chemical from meniscus 200 at a slightly lower flow rate than metering pump 310 is driven to supply chemical to the meniscus. In this manner, slightly more fluid is dispensed than removed by proximity head 110, allowing a small amount of fluid to remain on substrate 160 as chemical remainder 202.

Figure 7:
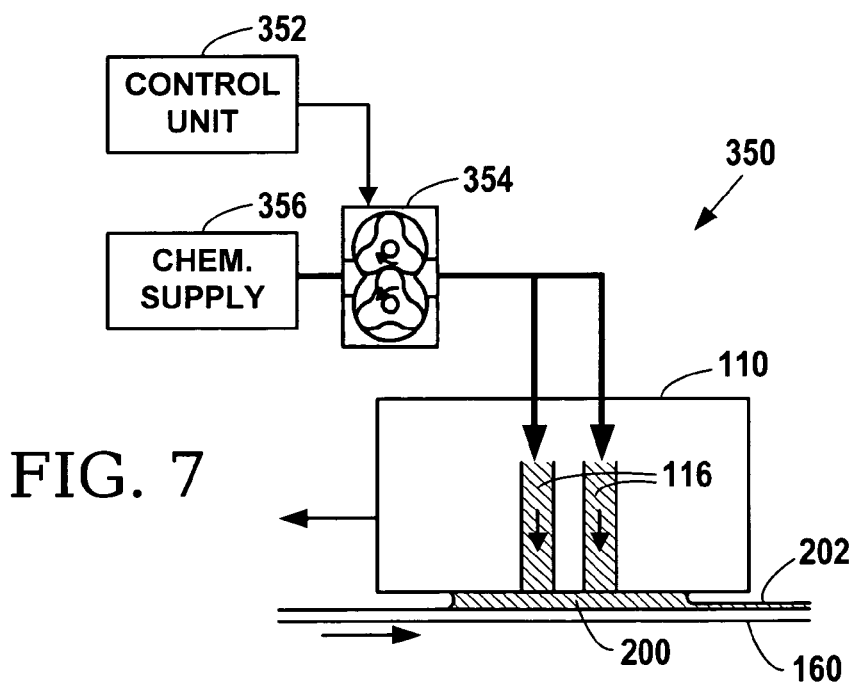
FIG. 7 shows an exemplary meniscus control system wherein the proximity head includes dispensing nozzles and no suction ports.

FIG. 7 shows exemplary meniscus control system 350 wherein proximity head 110 includes dispensing nozzles 116 and no suction ports 114, Hence, in this embodiment, the chemical is not actively removed from the meniscus by the proximity head. Control unit 352 drives metering pump 354 to draw a chemical from chemical supply 356 and supply the chemical to meniscus 200 via dispensing nozzles 116. Once meniscus 200 is formed, control unit 352 supplies only sufficient chemical to meniscus 200 to compensate for chemical remainder 202 adhering to substrate 160, and potentially also to carrier 150 (FIGS. 1, 4). It should be understood that a negligible amount of the chemical may additionally be removed by evaporation and/or lost to carrier 150 (FIGS. 1, 4).

Figure 8:
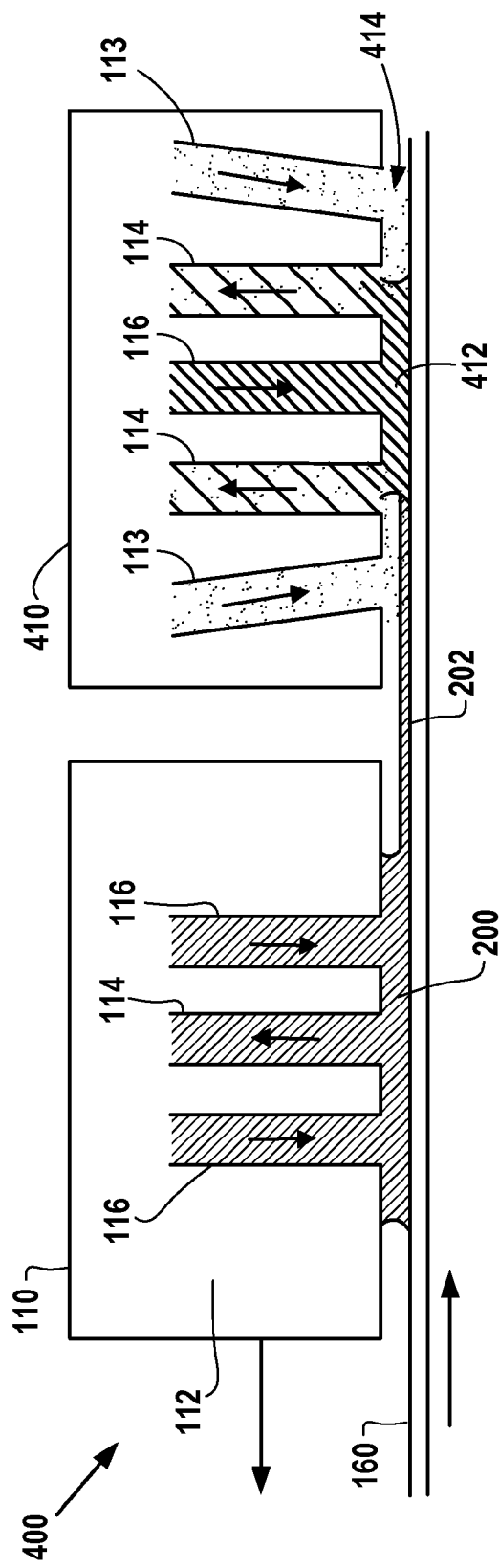
FIG. 8 shows a substrate processing system having a first proximity head and a second proximity head.

FIG. 8 shows a substrate processing system 400 having a first proximity head 110 and a second proximity head 410. Proximity head 110 is substantially as described above with reference to FIG. 2 and generates a meniscus 200 leaving a chemical remainder 202 adhering to substrate 160. Proximity head 410 includes centrally disposed dispensing nozzles 116 surrounded by suction ports that aspirate a mixture of liquid from meniscus 412 and surround gas. Proximity head may be constructed and operated as described in U.S. patent application Ser. No. 10/261,839 filed on Sep. 30, 2002, or U.S. patent application Ser. No. 10/404,692, filed Mar. 31, 2003, which are incorporated herein by reference. In one embodiment, gas nozzles 113 surround suction ports 114 and supply a mixture of nitrogen and isopropyl alcohol gas, which act to improve the integrity of liquid-vapor barrier of the meniscus. In one embodiment, meniscus 412 is formed from de-ionized water and effectively rinses and removes chemical remainder 202, and leaves substrate 160 dry and spot-free behind meniscus 412, e.g., at location 414.

Figure 9:
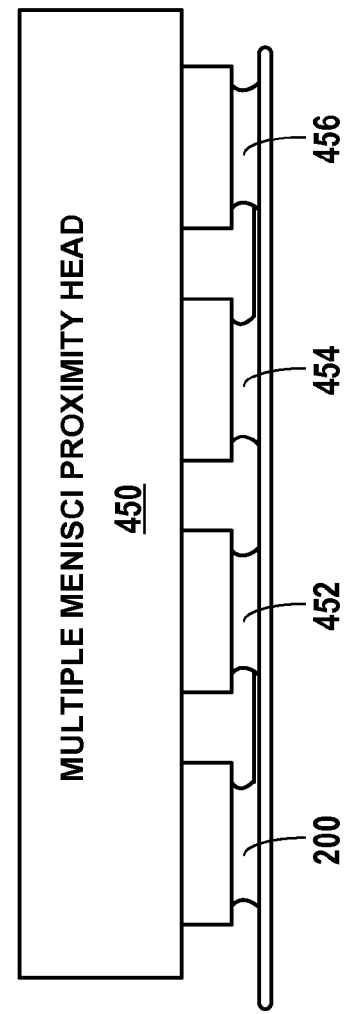
FIG. 9 shows by way of example a multiple menisci proximity head.

FIG. 9 shows by way of example a multiple menisci proximity head 450 generating menisci 200, 452, 454, and 456. It should be noted that any number of menisci can be generated. Multiple menisci proximity head 450 can be used carry out multi-step processes on substrates. For example, the standard RCA cleaning process for silicon wafers requires first removing organic contaminants, a second step for removing oxides, and a final step to remove metallic traces (ions).

Figure 10:
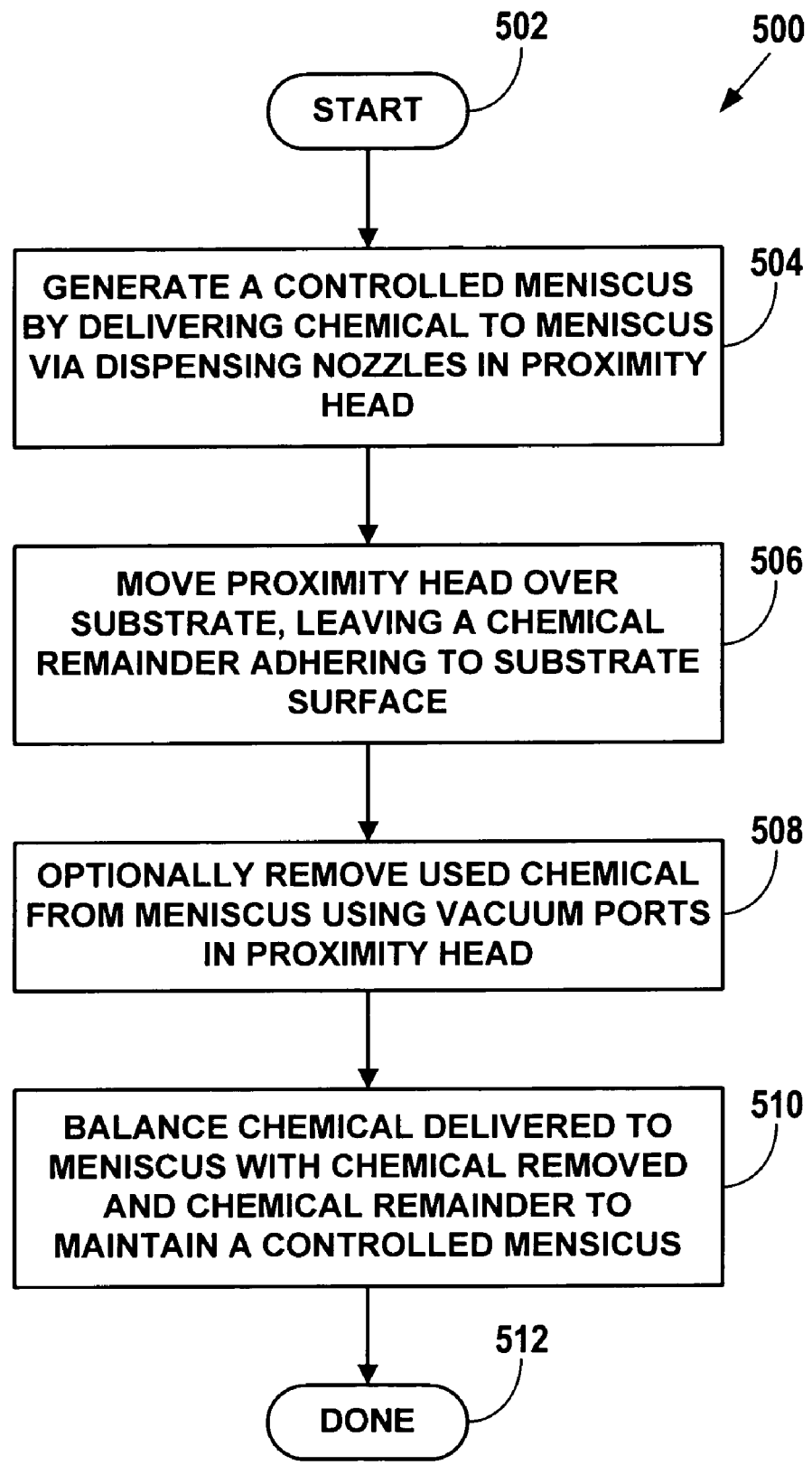
FIG. 10 shows a flowchart illustrating by way of example a procedure carried out with a substrate processing system.

FIG. 10 shows a flowchart 500 illustrating by way of example a procedure carried out with the substrate processing system herein described. The procedure begins as indicated by start block 502 and proceeds to operation 504 wherein a controlled meniscus is generated by delivering a chemical to the meniscus using dispensing nozzles in the proximity head. The flow can be controlled by gravity feeding the chemical to the proximity head as described above with reference to FIG. 5 or using metering pumps or other means to control the delivery of liquid chemical to the meniscus.

In operation 506, the proximity head is moved over the substrate, leaving a chemical remainder on the substrate surface. The chemical remainder may be, for example, a film of chemical adhering to the substrate surface. In one embodiment, a surfactant is added to the chemical to ensure adhesion with the substrate surface, which may or may not be hydrophilic.

In operation 508, used chemical is optionally removed from the meniscus using suction ports formed in the proximity head. It should be noted that, depending on the chemical processes, the chemical may degrade and need to be refreshed by removing used chemicals and supplying new chemicals. For example, if the chemical is used for oxide removal and the chemical comprises a solution of sulfuric acid, the acidity of the solution may reduce as it reacts with the substrate surface. In one embodiment, therefore, the chemical is constantly being replaced with unused chemical for the purpose of maintaining desired properties thereof. The flow rate of chemical removal may depend on the chemical and process involved. In another embodiment, chemical replacement is not required so that removal is unnecessary.

In operation 510, the meniscus is controlled by balancing the amount of chemical delivered to the meniscus with the amount of chemical removed and the amount of chemical remainder. The procedure then ends as indicated by operation 512. It should be noted that, although the operations presented in FIG. 10 are presented as being serial, they operations may be performed concurrently so that all operations take place simultaneously.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A system for processing a substrate, the system comprising:
    a first proximity head having a plurality of dispensing nozzles and a plurality of suction ports substantially surrounded by the plurality of dispensing nozzles, the first proximity head capable of defining a first meniscus over a surface of the substrate when present, and wherein the first proximity head does not include surrounding gas inputs, separate from the dispensing nozzles, disposed beside of the plurality of dispensing nozzles; and
    a second proximity head for generating a second meniscus over the surface of the substrate when present, the second proximity being positioned adjacent to the first proximity head, the second proximity head includes a plurality of dispensing nozzles that are substantially surrounded by a plurality of suction ports, and further including a plurality of gas nozzles substantially surrounding the suction ports, wherein the plurality of dispensing nozzles and plurality of suction ports are formed in a respective face of the first and second proximity heads, the respective faces having a substantially flat surface, and the first and second proximity heads having a length that is greater than a width, and the length extends at least a diameter of the substrate;
    wherein the positioning of the first and second proximity heads adjacent to each other orients the length of the first and second proximity heads parallel to each other;
    wherein the first and second proximity heads direct the respective faces in a same direction toward and proximate to the substrate when present;
    a mechanism to hold the first and second proximity heads adjacent and parallel to each other.

2. The system of claim 1, wherein in the first proximity head, further comprising:
    a liquid supply system in fluid communication with the dispensing nozzles;
    a liquid removal system in fluid communication with the suction ports; and
    a control unit coupled to each of the liquid supply system and the liquid removal system;
    wherein the liquid removal system of the first proximity head is coupled to a retrieval tank that feeds back to the liquid supply system for reuse as directed by the control unit.

3. The system of claim 1, further comprising:
    a carrier for holding the substrate, the carrier being connected to a track that enables the carrier to move under the first and second proximity heads and expose the surface of the substrate to the first meniscus followed by the second meniscus.

4. The system of claim 1, further comprising:
    a control unit for controlling the movement of the carrier having the substrate.

5. The system of claim 1, wherein the dispensing nozzles of the first proximity head are perpendicular to the face of the first proximity head.

6. The system of claim 1, wherein the dispensing nozzles of the first proximity head are angled toward the suction ports of the first proximity head.

7. The system of claim 1, wherein the section ports of the first proximity head are arranged along a center region of the face of the first proximity head.

8. The system of claim 7, wherein the dispensing nozzles of the first proximity head define a loop around in the face of the first proximity head.

9. A system for processing a substrate, the system comprising:
   a proximity head configured to generate a controlled meniscus formed from a liquid chemical, the proximity head having a plurality of dispensing nozzles and a plurality of suction ports formed on a face of the proximity head, the proximity head having a length that extends at least a diameter of the substrate and a width that is less than the length, the plurality of dispensing nozzles oriented to substantially surround the plurality of suction ports that are oriented at about a center region of the face of the proximity head;
   a chemical supply comprising a container containing a supply of the liquid chemical, the dispensing nozzles being in fluid communication with the chemical supply;
   a vacuum source, the suction ports being in fluid communication with the vacuum source to remove fluid from the center region of the face of the proximity head and a surface of the substrate when present; and
   a control unit, the control unit operatively connected to the chemical supply, the vacuum source, the control unit balancing a flow of the liquid chemical to and from the controlled meniscus so that the controlled meniscus remains in a stable state;
   wherein the face of the proximity head does not include surrounding gas inputs, separate from the dispensing nozzles, disposed beside of the plurality of dispensing nozzles;
   wherein the vacuum source is coupled to a retrieval tank that feeds back to the container for reuse of liquid chemical as directed by the control unit.

10. The system for processing a substrate of claim 9, wherein the vacuum source comprises a vacuum pump.

11. The system of claim 9, wherein the chemical supply further comprises a downwardly extending supply line and a control valve, the chemical being delivered to the proximity head under influence of gravity, the valve controlling a flow rate of the chemical through the supply line.

12. The system of claim 9, wherein the chemical supply further comprises a metering pump, the metering pump being operated by the control unit to supply the chemical to the proximity head at a controlled flow rate.

13. The system of claim 9, wherein the vacuum source further comprises an evacuation tank in fluid communication with the suction ports, and a pressure meter configured to generate a signal representative of a pressure within the evacuation tank, the vacuum source being in fluid communication with the evacuation tank, the control unit operating the vacuum source in response to the signal to maintain the pressure within the evacuation tank at a desired level, thereby controlling an amount of the chemical removed from the meniscus by the suction ports.

14. The system of claim 9, wherein the stable state of the meniscus comprises a meniscus having a substantially constant volume.

15. A system for processing a substrate, the system comprising:
   a proximity head configured to generate a meniscus formed from a liquid, the proximity head having a plurality of dispensing nozzles and a plurality of suction ports formed on a face of the proximity head, the proximity head having a length that extends at least a diameter of the substrate and a width that is less than the length, the plurality of dispensing nozzles oriented to substantially surround the plurality of suction ports that are oriented at about a center region of the face of the proximity head;
   wherein the face of the proximity head does not include surrounding gas inputs disposed beside of the plurality of dispensing nozzles;
   wherein the suction ports oriented about the center region are distributed along the length of the proximity head, and the dispensing nozzles oriented to substantially surround the plurality of suction ports define an loop of dispensing nozzles; and
   wherein the suction ports are coupled to a retrieval tank that feeds back for reuse of the liquid to the proximity head.

16. The system of claim 15, further comprising:
   a supply comprising a container containing a supply of the liquid obtained from the retrieval tank, the dispensing nozzles being in fluid communication with the supply;
   a vacuum source, the suction ports being in fluid communication with the vacuum source to remove fluid from the center region of the face of the proximity head and a surface of the substrate when present; and
   a control unit, the control unit operatively connected to the supply, the vacuum source, the control unit balancing a flow of the liquid to and from the meniscus so that the meniscus remains in a stable state.

* * * * *